(12) United States Patent
Park

(10) Patent No.: US 6,437,378 B1
(45) Date of Patent: Aug. 20, 2002

(54) CHARGE COUPLED DEVICES INCLUDING CHARGE SIGNAL AMPLIFIERS THEREIN

(75) Inventor: Sang-Sik Park, Kyunggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/399,515

(22) Filed: Sep. 20, 1999

(30) Foreign Application Priority Data

Sep. 21, 1998 (KR) .............................. 98-39100

(51) Int. Cl.[7] .................. H01L 27/148; H01L 29/76
(52) U.S. Cl. .................. 257/241; 257/239; 257/214; 257/912
(58) Field of Search ................. 257/239–241, 257/912, 257, 258, 292, 443, 444, 448; 377/60

(56) References Cited

U.S. PATENT DOCUMENTS

| 3,806,772 A | * | 4/1974 | Early ......................... 317/235 |
| 3,943,543 A | | 3/1976 | Caywood ..................... 357/24 |
| 4,097,885 A | | 6/1978 | Walsh ......................... 357/24 |
| 4,148,132 A | | 4/1979 | Bower ......................... 29/571 |
| 4,831,425 A | | 5/1989 | Pals et al. .................... 357/24 |
| 5,097,305 A | * | 3/1992 | Mead et al. ................... 35/30 |
| 5,202,907 A | * | 4/1993 | Yonemoto ..................... 377/60 |
| 5,270,559 A | | 12/1993 | Yariv et al. ................. 257/249 |
| 5,369,293 A | | 11/1994 | Slob ......................... 257/241 |
| 5,483,090 A | * | 1/1996 | Kitamura et al. ........... 257/231 |
| 5,498,887 A | * | 3/1996 | Ohki et al. ................. 257/239 |
| 5,563,429 A | * | 10/1996 | Isogai ....................... 257/258 |
| 5,942,774 A | * | 8/1999 | Isogai et al. ............... 257/292 |
| 5,990,471 A | * | 11/1999 | Watanabe ................ 250/208.1 |

FOREIGN PATENT DOCUMENTS

JP         10-50977       *  2/1998     ......... H01L/27/148

* cited by examiner

Primary Examiner—Steven Loke
Assistant Examiner—Ori Nadav
(74) Attorney, Agent, or Firm—Myers Bigel Sibley & Sajovec

(57) ABSTRACT

A charge coupled device includes an integrated circuit substrate and a transfer circuit, in the integrated circuit substrate, that transfers charge signals in the charge coupled device to provide transferred charge signals. An amplifier, in the integrated circuit substrate and electrically coupled to the transfer circuit, amplifies the transferred charge signals to generate amplified charge signals. Related methods are also discussed.

21 Claims, 5 Drawing Sheets

CHARGE COUPLED DEVICES INCLUDING CHARGE SIGNAL AMPLIFIERS THEREIN

CROSS REFERENCE TO RELATED APPLICATION

This application claims the benefit of Korean Patent Application No. 98-39100, filed Sep. 21, 1998, the entire disclosure of which is hereby incorporated herein by reference.

FIELD OF THE INVENTION

The present invention relates to the field of integrated circuits in general, and more particularly to charge coupled devices.

BACKGROUND OF THE INVENTION

Solid state image pickup devices, such as Charge Coupled Devices (CCDs), can be relatively small, light weight, and consume less power than other image pickup type devices such as an electron gun. Therefore, it is known to use CCDs in broadcasting, domestic video cameras, monitoring camera systems, digital still cameras, and the like.

The CCD shown in FIG. 1 is arranged in the form of a charge coupled array that includes a horizontal transfer section 10. The horizontal transfer section 10 includes transfer gate electrodes 12 formed on an integrated circuit substrate such as a semiconductor substrate 11. An output gate electrode 13 is disposed adjacent to the last one of the transfer gate electrodes 12 on the semiconductor substrate 11. An n type impurity region 14 is formed in the semiconductor substrate 11 adjacent to the output gate electrode 13. The n type impurity region 14 is a floating diffusion region.

A reset gate electrode 16 is disposed between the floating diffusion region 14 and an n type impurity region 15. The n type impurity region 15 is formed in the surface region of the semiconductor substrate 11 adjacent to the reset gate electrode 16. The floating diffusion region 14, the n type impurity region 15 and the reset gate electrode 16 form a Field Effect Transistor (FET) 20.

In operation, the potential at the floating diffusion region 14 is reset to the voltage level VOD by application the reset signal φR. Signal charges are transferred from the array by the horizontal transfer section 10 and converted from signal charges into signal voltages in accordance with the respective variation of the input potential from the reset voltage level. In particular, clock signals φH applied at the output gate electrode 13 cause electrons (charge signals) to enter the floating diffusion region 14. The electrons are stored in the floating diffusion region 14 in accordance with the capacitance associated with the floating diffusion region 14.

The presence of the charge signals in the floating diffusion region 14 may 10 cause the voltage level thereon to be lowered compared with the initial reset voltage level which is provided by the reset signal φR. The output circuit 30 detects the lowering of the potential of the floating diffusion region 14 and outputs a corresponding voltage level. The voltage level at the floating diffusion region is reset by the application of the reset signal φR before reading the next charge signals.

It is known to use CCDs in situations having relatively low levels of illumination, wherein respective weak signal charges may need to be converted into signal voltages for output. Unfortunately, as the area occupied by the CCDs decreases, the capacitance of the floating diffusion region 14 may make it difficult to provide adequate signal voltages in situations involving low level illumination. Accordingly, there is a need to allow improved CCDs and methods of transferring charge signals in CCDs.

SUMMARY OF THE INVENTION

It is, therefore, an object of the present invention to allow improved charge coupled devices and methods of transferring charge signals from charge coupled devices.

It is another object of the present invention to allow charge coupled devices having increased sensitivity.

These, and other objects of the present invention, may be achieved by charge coupled devices that include an integrated circuit substrate and a transfer circuit, in the integrated circuit substrate, that transfers charge signals in the charge coupled device to provide transferred charge signals. An amplifier, in the integrated circuit substrate and electrically coupled to the transfer circuit, amplifies the transferred charge signals to generate amplified charge signals.

According to the present invention, the amplifier can provide improved sensitivity by amplifying the transferred charge signals. The amplified charge signals can be amplified by a gain factor ($\beta$) of the amplifier. The sensitivity of the charge coupled device may also be increased by reducing the associated capacitance.

In another aspect of the present invention, the charge coupled device includes an output circuit, electrically coupled to the amplifier, that outputs the amplified charge signals from the charge coupled device.

In another aspect of the present invention, the charge coupled device includes a reset circuit, electrically coupled to the amplifier, that resets a level of the amplified charge signals in response to a reset signal applied to the reset circuit.

In one embodiment, the reset circuit is a field effect transistor that includes a drain region electrically coupled to a reset voltage level and a gate region electrically coupled to a reset signal line. A source region is electrically coupled to the amplifier and the n type semiconductor source region electrically couples the amplifier to the reset voltage level in response to a reset signal applied to the reset signal line.

DESCRIPTION OF THE PREFERRED EMBODIMENTS

Figure 1:
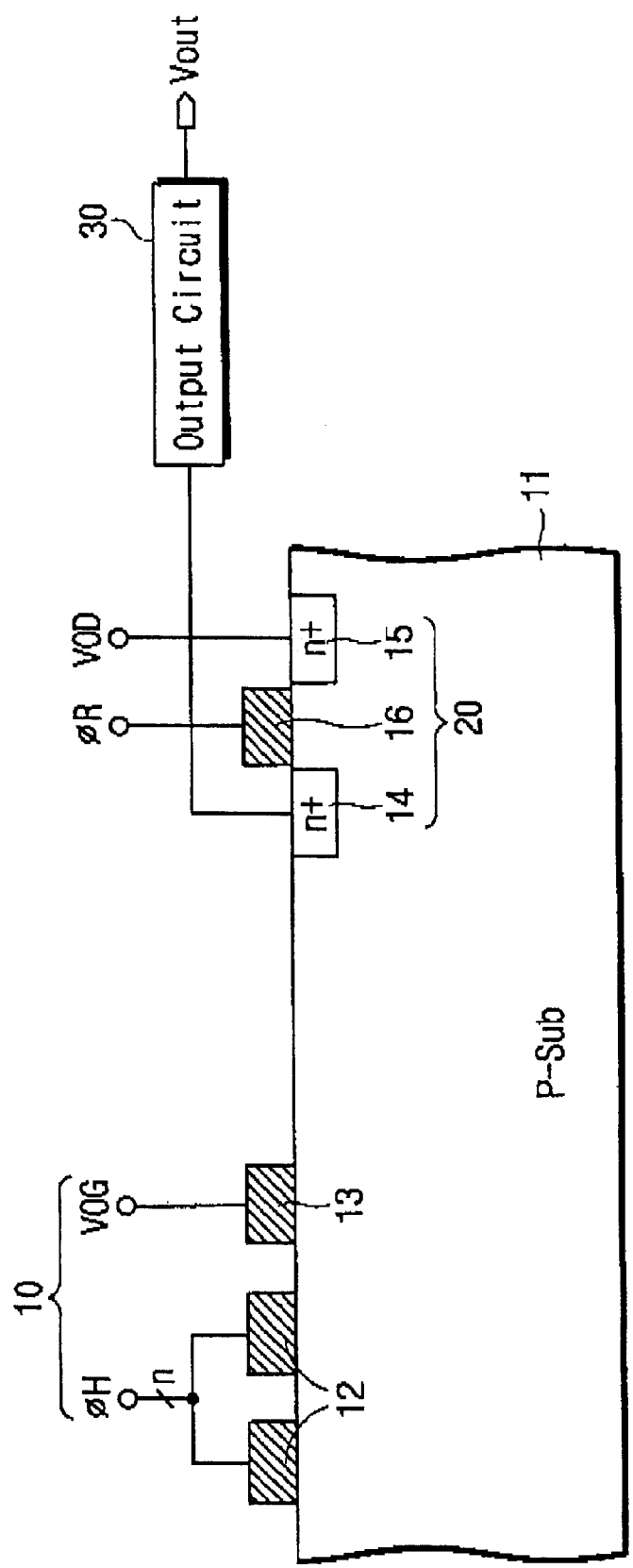
FIG. 1 is an enlarged cross-sectional view of a conventional CCD.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

In the drawings, the thickness of layers and regions are exaggerated for clarity. It will be understood that when an element such as a layer, region or substrate is referred to as being "on" another element, it can be directly on the other element or intervening elements may also be present.

Figure 2:
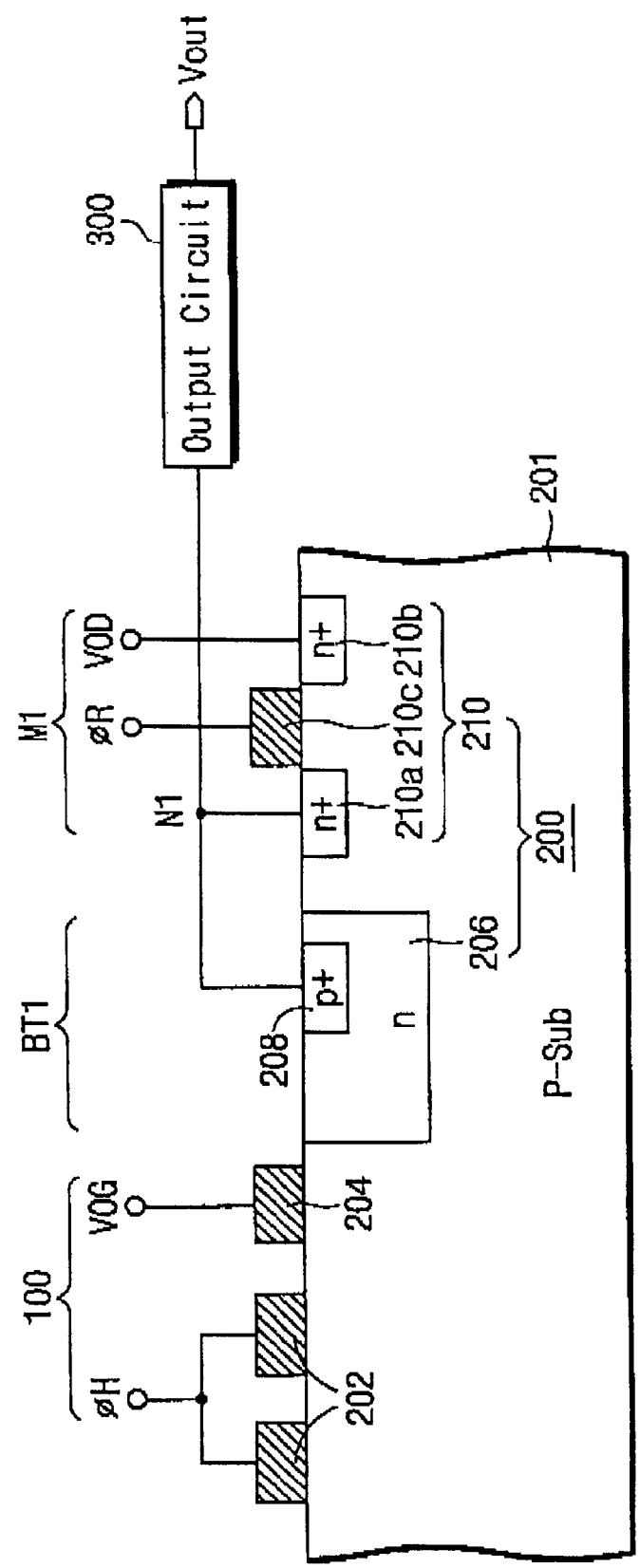
FIG. 2 is an enlarged cross-sectional view of a first embodiment of a CCD according to the present invention.

FIG. 2 is an enlarged cross-sectional view of a first embodiment of a CCD according to the present invention. According to FIG. 2, a plurality of electrodes 202 are formed on an integrated circuit substrate such as on a p type semiconductor substrate (substrate) 201 to transfer signal charges in response to clock signals φH provided to the plurality of gate electrodes 202 by a plurality of n respective clock lines. The clock signals φH cause charge signals stored in the substrate 201 opposite the respective transfer gate electrodes 202 to be transferred toward the output electrode 204. The output electrode 204 receives an output gate voltage level VOG which may allow the charge signals to be transferred from the charge coupled array. It will be understood that the signal charges are transferred, according to techniques well known in the art, through a moving or shifting potential well structure by, for example, three other clocks applied to the plurality of electrodes 202.

The charge signals are transferred to Bipolar Junction Transistor (BJT) BT1 or amplifier which includes an n type impurity region in the substrate 201 which serves as a base region 206. The base region 206 is formed in the substrate 201 which serves as a collector region of the BJT BT1. A p type impurity region in the n type impurity region provides a first floating diffusion region which serves as a emitter region 208 of the BJT BT1.

A Field Effect Transistor (FET) M1 210 (or reset circuit) is formed in the substrate 201 adjacent to the BJT BT1. The FET M1 includes a second floating diffusion region formed in the substrate 201 which serves a source region 210a adjacent to the base region 206. A reset gate electrode 210c is formed between the source region 210b and an n type impurity region, which serves as a drain region 21b. The reset gate electrode 210c receives reset clocks φR. The drain region 210b is biased by a drain voltage level VOD.

The emitter region 208 and the source region 210a are electrically coupled (at a node N1) to an output circuit 300. The output circuit 300 can be a source follower circuit. The output circuit 300 converts signal charges from the emitter region 208 and source region 210a to signal voltages which are output as output voltage Vout.

The signal charges transferred by the transfer gate electrodes 202 are injected into the emitter region 208. Under this condition, the drain 210b receives the voltage VOD, and therefore, the emitter region 208 is reset to the potential of the voltage VOD when the reset clocks φR is applied to the reset gate electrode 210.

When a high level reset clock φR is supplied to the reset gate electrode 210c, the emitter region 208, the source region 210a, and the gate of the output circuit 300 are charged to the VOD voltage level. Under this condition, the output gate electrode 204 is blocked and, therefore, signal charges are not transferred to the base region 206. Further, the base region 206 and the substrate 201 (collector region of BJT BT1) are reverse biased, and therefore, current does not flow to the node N1. Under this condition, the voltage level at the node N1 is sampled.

When a low level reset clock signal φR is supplied, the signal charges cross the output gate electrode 204 to the base region 206. When the signal charges are transferred to the base region 206, current i flows to the ground based on the following equations:

$$i_C = \beta i_B \qquad (1)$$

$$i_E = i_C + i_B \qquad (2)$$

$$i_E = (1+\beta) i_B \qquad (3)$$

In the above formulas, β is a constant for a particular transistor, i.e., a common emitter current gain. The value of β can depend on the width of the base region 206 and on the relative doping between the emitter region 208 and the base region 206. Preferably, the base region 206 is relatively thin, and is doped with an N impurity at low concentration, while the emitter region 208 is doped with a p type impurity at a high concentration. According to equations (1)–(3), the collector current $i_c$ is the product of β and the base current $i_B$, and therefore, the potential at the emitter region 208 is amplified by about β. Therefore, the detection sensitivity can be increased.

When charge is transferred to the emitter region 208 the potential at the node N1 varies from the voltage VOD (provided via the reset transistor) according to the number of signal charges that flow into the emitter region 208. The potential at the emitter region 208 is supplied to the output circuit 300, and the corresponding signal voltages are output from the output circuit 300. The potential at the emitter region 208 can be expressed as:

$$\Delta V = \frac{\Delta Q}{C} \qquad (4)$$

where ΔV indicates the potential variation from the potential established by the reset transistor, ΔQ is the amount of charge introduced into the first floating diffusion region 208 and C indicates the sum of the input capacitance of the source follower circuit and the capacitance of the diffusion injection region.

According to equation (4), if C is small, ΔV becomes large for a given amount of charge that flows into the emitter 208. Therefore, the detection sensitivity can be improved by decreasing the total capacitance associated with the floating diffusion regions (the emitter region 208 of the BJT BT2 and the source region of the FET M1). The total capacitance of the entire floating diffusion region is formed from the capacitance between the emitter region 208 and the substrate 201 (Cs), the capacitance between the emitter region 208 and the output circuit 300 (C1), the capacitance between the source region 210a and the reset gate (C2), and the capacitance between the gate electrode and a drain region of a transistor in the output circuit 300 (C3). C1, C2 and C3 are connected in series in the signal path between the emitter region 208 and the output circuit 300. The resulting series capacitance is less than the smallest capacitance of capacitances C1, C2, and C3. The addition of the series capacitance associated with the emitter region 208 thus can reduce total capacitance in comparison to conventional devices.

Figure 3:
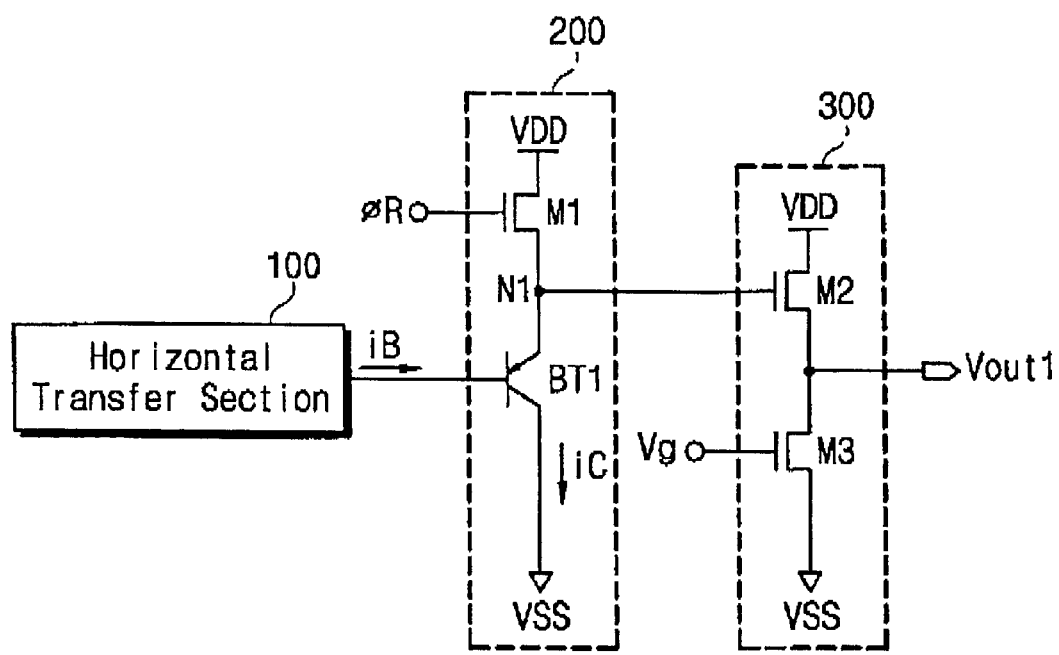
FIG. 3 is a circuit schematic diagram of the first embodiment of a CCD shown in FIG. 1.

FIG. 3 is a circuit schematic diagram of a CCD of FIG. 2. As shown in FIG. 3, the CCD includes the FET M1 and the BJT BT1. The FET M1 receives reset lock signals φR at the gate electrode 210c and receives voltage levels VOD at the rain region 210b. The base region 206 of the BJT BT1 is electrically connected to a transfer circuit 100 and the emitter region 208 is electrically coupled to the source region 210a of the FET M1 and the collector region (substrate 201) is grounded.

The CCD can include an output circuit 300 which includes NMOS transistors M2 and M3 which can provide serially connected channels between a power source voltage level VDD and a ground voltage level VSS. The gate of the NMOS transistor M2 is electrically coupled to the node N1 and the emitter region 208 of the BJT BT1, while the gate of the NMOS transistor M3 is electrically coupled to a voltage level Vg applied via a control terminal. Vg preferably is a fixed voltage, e.g., 2V such that the MOS transistor M3 acts as a resistance element.

Figure 4:
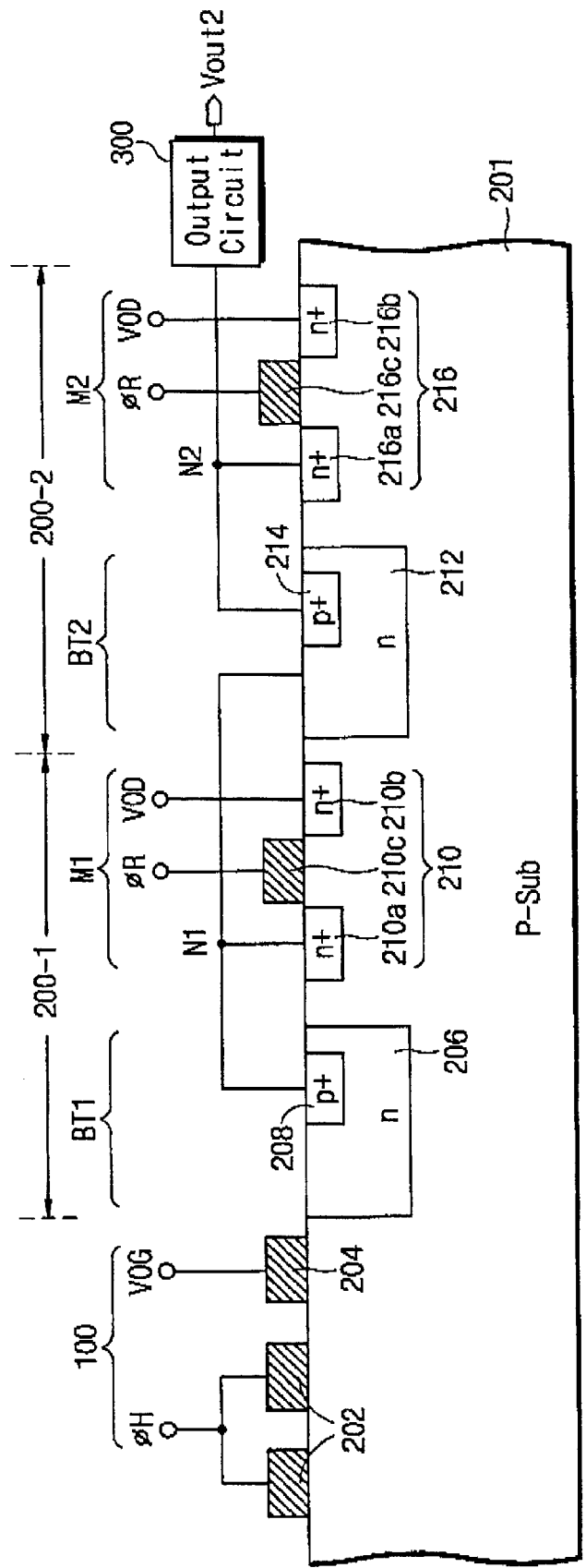
FIG. 4 is an enlarged cross-sectional view of a second embodiment of a CCD according to the present invention.
Figure 5:
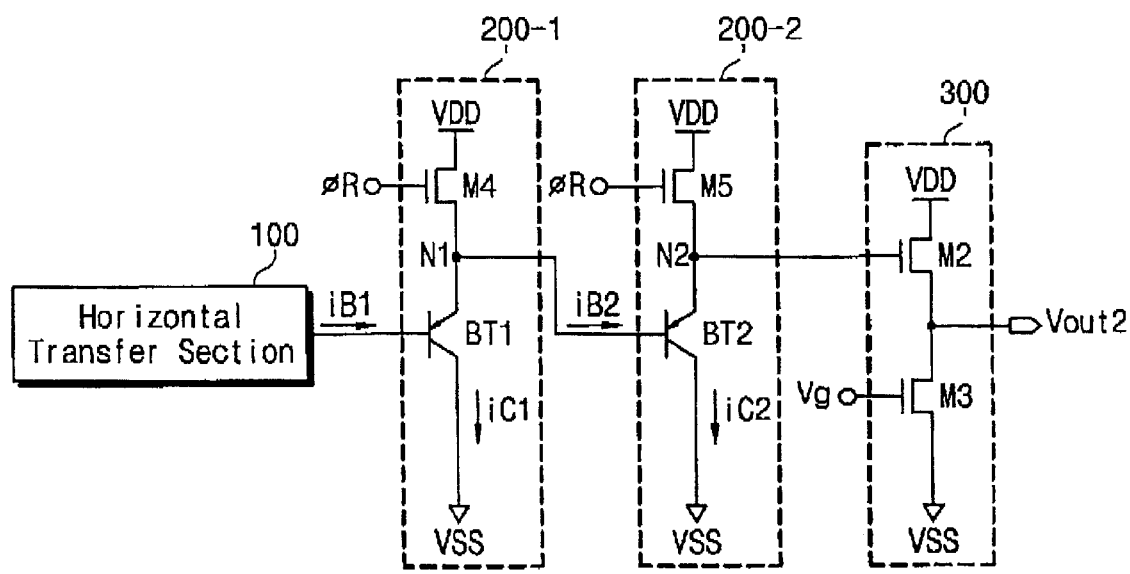
FIG. 5 is a circuit schematic diagram of the second embodiment of a CCD shown in FIG. 4.

FIG. 4 is an enlarged cross-sectional view of a second embodiment of a CCD according to the present invention. FIG. 5 is a circuit schematic diagram of a CCD shown in FIG. 4. As shown in FIG. 4, the CCD includes a horizontal transfer section 100, the first BJT BT1, the first FET M1, a second BJT BT2, a second FET M2, and the output circuit 300.

The horizontal transfer section 100 includes the plurality of gate electrodes 202 on the substrate 201, which transfer signal charges in response to clock signals φH and output voltages VOG. The first BJT BT1 and the first FET M1 are located in a first region 200-1 of the substrate 201 adjacent to the output gate electrode 204 which is preferably the last one of the plurality of gate electrodes 202–204.

The first BJT BT1 includes the first base region 206 adjacent to the output gate electrode 204 and the first emitter region 208 within base region 206. The first FET M1 includes the drain region 210b biased by a power source voltage level VDD or by the drain voltage VOD. The gate electrode 210c receives the reset clock signal φR and the source region 210b is electrically coupled to the emitter region 208 and to the node N1.

The second BJT BT2 and the second FET M2 are located in a second region 200-2 of the substrate 201. The second BJT BT2 and the second FET M2 have structures which are analogous to the respective structures of the first BJT BT1 and the first FET M1. The first emitter region 208 is electrically coupled to a second base region 212 of the second BJT BT2 so that the emitter current generated by the first BJT BT1 flows to the second base region 212 of the second BJT BT2.

When reset clock signal φR1 is supplied to reset gate electrodes 210c and 216c, the capacitance associated with the gate of the source follower circuit and the floating diffusion regions 208, 210a, 214 and 216c are charged to a the voltage level associated with VOD. Under this condition, the output gate electrode 204 is blocked, and the base and the collector are reverse biased, thereby reducing the signal charges transferred to the base region 208. Accordingly, current may not flow to the first and second nodes N1, N2.

When the φH clock signals are supplied, the charge signals cross the output gate electrode 204 to first base region 206. The charge signals flow to the ground as described in equation (1), thereby generating a first current of $\beta i_B$ which causes a second current of $i_B\beta^2$ to be generated by the second BJT BT2.

According to the present invention, amplifiers are included in CCDs to amplify the potential variation of the floating diffusion regions. Consequently, the signal charge detection sensitivity of the output circuit can be improved.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A charge coupled device comprising:

an integrated circuit substrate;

a transfer circuit, in the integrated circuit substrate, that transfers charge signals in the charge coupled device to provide transferred charge signals;

an amplifier, in the integrated circuit substrate and electrically coupled to the transfer circuit, that amplifies the transferred charge signals to generate amplified charge signals;

a reset circuit that resets a level of the amplified charge signals in response to a reset signal applied thereto; and an ohmic conductor, on the integrated circuit substrate, that electrically couples the reset circuit to the amplifier to provide the amplified charge signals to the reset circuit.

2. The charge coupled device of claim 1 further comprising:

an output circuit, electrically coupled to the amplifier, that outputs the amplified charge signals from the integrated circuit substrate.

3. The charge coupled device of claim 1, wherein the reset circuit comprises a field effect transistor including:

a drain region electrically coupled to a reset voltage level;

a gate region electrically coupled to a reset signal line; and a source region, electrically coupled to the amplifier, that electrically couples the amplifier to the reset voltage level in response to a reset signal applied to the reset signal line.

4. The charge coupled device of claim 1, wherein the amplifier comprises a bipolar junction transistor including:

a semiconductor collector region;

a semiconductor base region in the semiconductor collector region; and a semiconductor emitter region in the semiconductor base region, electrically coupled to the ohmic conductor, wherein the transferred charge signals flow to the semiconductor base region in response to an output gate signal applied to the transfer circuit and are amplified to provide the amplified charge signals.

5. The charge coupled device of claim 4, wherein the semiconductor collector region comprises a semiconductor substrate.

6. The charge coupled device of claim 1 further comprising:

a second amplifier in the integrated circuit substrate that amplifies the amplified charge signals to provide second amplified charge signals.

7. The charge coupled device of claim 6 further comprising:

a second reset circuit, electrically coupled to the second amplifier, that provides a second level of the second amplified charge signals in response to a second reset signal applied to the second reset circuit.

8. The charge coupled device of claim 2, wherein the output circuit comprises a source follower circuit.

9. The charge coupled device of claim 1, wherein the ohmic conductor electrically couples the reset circuit to the amplifier while the transferred charge signals are being provided to the amplifier.

10. The charge coupled device of claim 1, wherein the ohmic conductor comprises a metalized contact on the integrated circuit substrate.

11. A charge coupled device comprising:

an integrated circuit substrate;

a transfer circuit, in the integrated circuit substrate, that transfers charge signals in the integrated circuit substrate to provide transferred charge signals;

a first amplifier, in the substrate and electrically coupled to the transfer circuit, that amplifies the transferred charge signals to provide first amplified charge signals, a second amplifier in the substrate and electrically coupled to the first amplifier circuit, that amplifies the first amplified charge signals to generate second amplified signals;

a first reset circuit, electrically coupled to the first amplifier, that provides a first level of the first amplified charge signals at an output of the first amplifier in response to a first reset signal applied to the first reset circuit;

a second reset circuit, electrically coupled to the second amplifier, that provides a first level of the second amplified charge signals at an output of the second amplifier in response to a second reset signal applied to the second reset circuit;

a first ohmic conductor that electrically couples the first reset circuit to the first amplifier to provide the first amplified charge signals to the first reset circuit; and a second ohmic conductor that electrically couples the second reset circuit to the second amplifier to provide the second amplified charge signals to the second reset circuit.

12. The charge coupled device of claim 11 further comprising:

an output circuit, electrically coupled to the second amplifier, that outputs the second amplified charge signals from the integrated circuit substrate.

13. The charge coupled device of claim 10, wherein the first reset circuit comprises a field effect transistor including:

a drain region electrically coupled to a reset voltage level line;

a gate region electrically coupled to a reset signal line and a source region, electrically coupled to the first amplifier, wherein the source region electrically couples the first amplifier to the reset voltage level line in response to a reset signal applied to the reset signal line.

14. The charge coupled device of claim 11, wherein the first amplifier comprises a bipolar junction transistor including:

a semiconductor collector region;

a semiconductor base region in the semiconductor collector region; and a semiconductor emitter region in the semiconductor base region that is electrically coupled to the second amplifier circuit, wherein the transferred charge signals flow to the semiconductor base region in response to an output gate signal applied to the transfer circuit and are amplified to provide the first amplified charge signals.

15. The charge coupled device of claim 12, wherein the output circuit comprises a source follower circuit.

16. A charge coupled device comprising:

an integrated circuit substrate;

means for transferring charge signals in the integrated circuit substrate to provide transferred charge signals;

means, in the integrated circuit substrate, for amplifying the transferred charge signals to provide amplified charge signals;

means for resetting a level of the amplified charge signals in response to a reset signal applied thereto; and an ohmic conductor, on the integrated circuit substrate, that electrically couples the means for resetting to the means for amplifying to provide the amplified charge signals to the means for resetting.

17. The charge coupled device of claim 16 further comprising:

second means for amplifying the amplified charge signals in the integrated circuit substrate to provide second amplified charge signals to the means for outputting.

18. The charge coupled device of claim 17 further comprising:

second means for resetting a second level of the second amplified charge signals in response to a second reset signal applied to the second means for resetting.

19. The charge coupled device of claim 10, wherein the first and second ohmic conductors comprise first and second metalized contacts on the integrated circuit substrate.

20. The charge coupled device of claim 19, wherein the first and second metalized contacts are directly on the integrated circuit substrate.

21. The charge coupled device of claim 16, wherein the ohmic conductor comprises a metalized contact on the integrated circuit substrate.

* * * * *